US008825714B2

(12) United States Patent
Lin et al.

(10) Patent No.: US 8,825,714 B2
(45) Date of Patent: Sep. 2, 2014

(54) SYSTEM AND METHOD FOR CONVERTING COMPONENT DATA

(75) Inventors: Sze-Yu Lin, New Taipei (TW); Hsing-Hui Chiu, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 62 days.

(21) Appl. No.: 13/479,298

(22) Filed: May 24, 2012

(65) Prior Publication Data

US 2012/0323973 A1 Dec. 20, 2012

(30) Foreign Application Priority Data

Jun. 16, 2011 (TW) .................................. 100120992

(51) Int. Cl.
*G06F 17/30* (2006.01)
*G06F 17/50* (2006.01)

(52) U.S. Cl.
CPC ........ *G06F 17/5045* (2013.01); *G06F 17/5063* (2013.01)
USPC ........... 707/803; 707/812; 716/103; 716/106; 716/112; 716/130

(58) Field of Classification Search
CPC ............ G06F 17/5063; G06F 17/5045; G06F 17/5068; G06F 2217/14
USPC .................. 707/705, 802, E17.008, E17.032, 707/E17.044, 803, 812; 716/18, 3, 4, 5, 6, 716/17, 112, 130, 106, 103; 717/171, 11, 1, 717/100, 104; 709/220, 221, 219, 203
See application file for complete search history.

(56) References Cited

U.S. PATENT DOCUMENTS

| 5,404,319 | A | * | 4/1995 | Smith et al. ................... 716/103 |
| 5,422,833 | A | * | 6/1995 | Kelem et al. .................... 703/14 |
| 5,553,001 | A | * | 9/1996 | Seidel et al. ................... 716/103 |
| 5,623,418 | A | * | 4/1997 | Rostoker et al. .............. 716/102 |
| 5,801,958 | A | * | 9/1998 | Dangelo et al. ............... 716/102 |
| 5,971,595 | A | * | 10/1999 | Grant et al. .................... 716/103 |
| 6,366,874 | B1 | * | 4/2002 | Lee et al. ........................ 703/14 |
| 6,634,008 | B1 | * | 10/2003 | Dole ............................... 716/55 |
| 6,732,350 | B1 | * | 5/2004 | Falk .............................. 716/103 |
| 7,146,581 | B2 | * | 12/2006 | Klein ............................ 716/103 |
| 7,184,946 | B2 | * | 2/2007 | Ballagh et al. ................. 703/23 |

(Continued)

OTHER PUBLICATIONS

David Parsons, Awais Rashid, Alexandru Telea and Andreas Speck—"An architectural pattern for designing component-based application frameworks"—Software: Practice and Experience—vol. 36, Issue 2, pp. 157-190, Feb. 2006.*

(Continued)

*Primary Examiner* — Anh Ly
(74) *Attorney, Agent, or Firm* — Novak Druce Connolly Bove + Quigg LLP

(57) ABSTRACT

An application server reads components data from a component information system (CIS) of a database server connected to the application server. The components data are converted to HDL data. If the converted HDL data includes illegal characters, a user is prompted to modify the illegal characters. If the converted HDL data does not include illegal characters, the application server amends formats of the converted HDL data according to requirements of each client connected to the application server. Each client includes a drawing unit. The application server controls the drawing unit to draw circuit diagram using the HDL data with the amended formats.

6 Claims, 3 Drawing Sheets

(56) References Cited

U.S. PATENT DOCUMENTS

| | | | |
|---|---|---|---|
| 7,203,632 B2* | 4/2007 | Milne et al. | 703/14 |
| 7,257,803 B1* | 8/2007 | Wilton et al. | 716/105 |
| 2003/0033374 A1* | 2/2003 | Horn et al. | 709/217 |
| 2003/0033595 A1* | 2/2003 | Takagi et al. | 717/143 |
| 2004/0073546 A1* | 4/2004 | Forster et al. | 707/4 |
| 2004/0194038 A1* | 9/2004 | Tamai | 716/1 |
| 2004/0225459 A1* | 11/2004 | Krishnaswamy et al. | 702/57 |
| 2005/0154551 A1* | 7/2005 | Pramanick et al. | 702/119 |
| 2005/0198606 A1* | 9/2005 | Gupta et al. | 716/18 |
| 2005/0256872 A1* | 11/2005 | Childs et al. | 707/9 |
| 2006/0015862 A1* | 1/2006 | Odom et al. | 717/168 |
| 2006/0117274 A1* | 6/2006 | Tseng et al. | 716/1 |
| 2007/0061487 A1* | 3/2007 | Moore et al. | 709/246 |
| 2007/0271545 A1* | 11/2007 | Eng | 716/18 |
| 2008/0066046 A1* | 3/2008 | Ogilvie et al. | 716/18 |
| 2008/0189677 A1* | 8/2008 | Cote et al. | 717/105 |
| 2009/0013301 A1* | 1/2009 | Ogilvie et al. | 716/18 |
| 2009/0049419 A1* | 2/2009 | Kato et al. | 716/16 |
| 2009/0228848 A1* | 9/2009 | Kumazaki | 716/5 |
| 2010/0281451 A1* | 11/2010 | Eng | 716/106 |
| 2011/0179402 A1* | 7/2011 | Buckley et al. | 717/140 |

OTHER PUBLICATIONS

"Data processing on FPGAs"—Rene Mueller, Jens Teubner, and Gustavo Alonso—Proceedings of the VLDB Endowment, vol. 2 Issue 1—Aug. 2009—pp. 910-921.*

* cited by examiner

SYSTEM AND METHOD FOR CONVERTING COMPONENT DATA

BACKGROUND

1. Technical Field

Embodiments of the present disclosure relate to component data management systems and methods, and particularly to a system and a method for converting component data.

2. Description of Related Art

Hardware description language (HDL) application programs are programs for drawing circuit diagrams. Most of these HDL application programs have no component information system (CIS), which includes components data in relation to the circuit diagrams. If a client wants to use the HDL application programs to draw the circuit diagrams, the components data in the CIS cannot be directly used by the HDL application programs.

DETAILED DESCRIPTION

The application is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media may include CDs, DVDs, BLU-RAY, flash memory, and hard disk drives.

Figure 1:
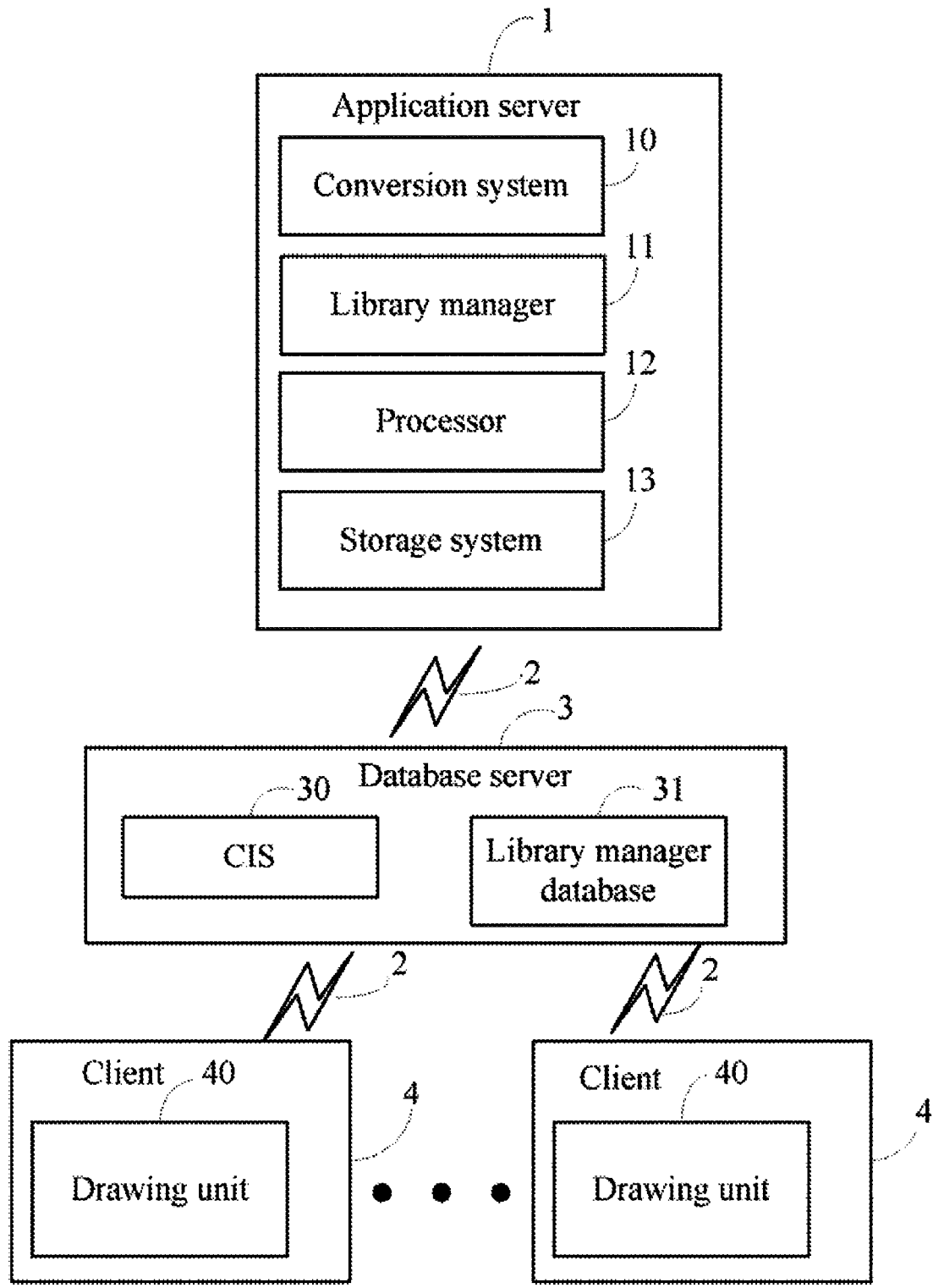
FIG. 1 is a block diagram of one embodiment of an application server comprising a conversion system.

FIG. 1 is a block diagram of one embodiment of an application server 1 comprising a conversion system 10 and a library manager 11. The library manager 11 is application software that allows users to manage hardware description language (HDL) libraries. The application server 1 is connected to a database server 3 and more than one client 4 via a network 2. The network 2 may be Intranet or Internet. The database server 3 includes a component information system (CIS) 30 and a library manager database 31. The CIS 30 stores components data for drawing circuit diagrams. Each client 4 includes a drawing unit 40. In the embodiment, the drawing unit 40 is a HDL application program. The client 4 draws circuit diagrams using the HDL application program with components data with formats of HDL.

In an exemplary embodiment, the application server 1 includes at least one processor 12 and a storage system 13. The conversion system 10 may include one or more modules (as in FIG. 2). The one or more modules may comprise computerized code in the form of one or more software programs that are stored in the storage system 13 (or memory). In one embodiment, the storage system 13 may be a magnetic or an optical storage system or other suitable storage medium. The computerized code includes instructions that are executed by the at least one processor 12 to provide functions of the modules as described below.

Figure 2:
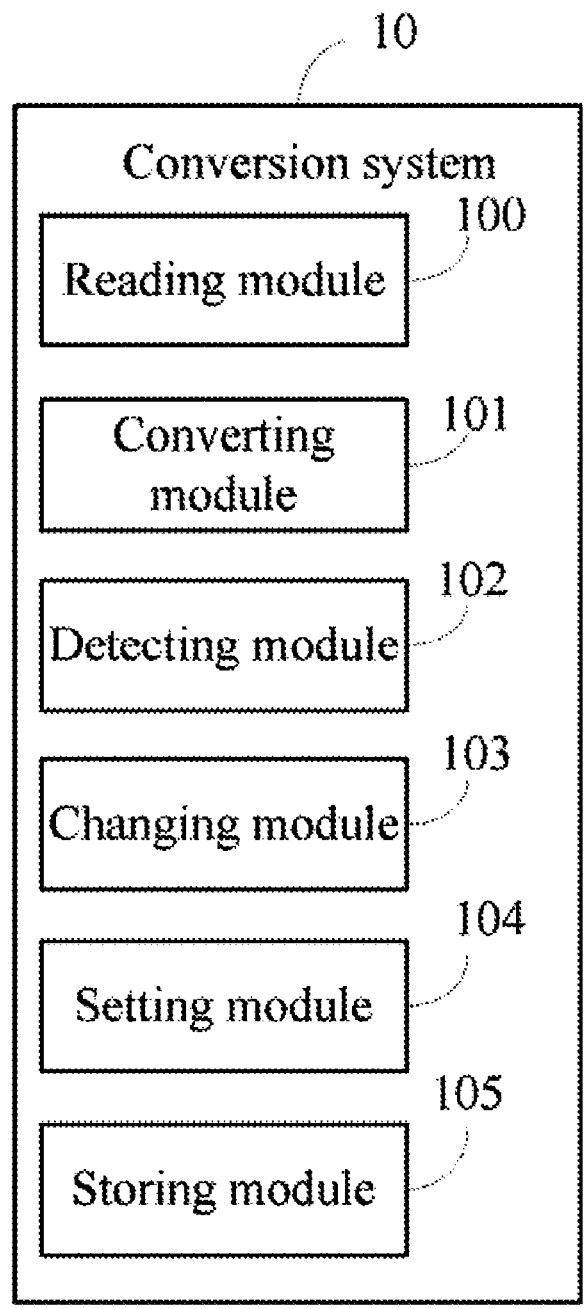
FIG. 2 is a block diagram of one embodiment of the function modules of the conversion system in FIG. 1.

As shown in FIG. 2, the conversion system 10 may include a reading module 100, a converting module 101, a detecting module 102, a changing module 103, a setting module 104, and a storing module 105.

The reading module 100 reads components data from the CIS 30.

The converting module 101 converts the components data to HDL data which are described by HDL.

The detecting module 102 detects if there are any illegal characters in the converted HDL data. The illegal characters are characters which cannot be recognized by the library manager database 31. For example, a space character cannot be recognized by the library manager database 31. The space character is defined as the illegal character.

The changing module 103 prompts the user to modify the illegal characters and stores modified characters to the CIS 30 if there are illegal characters in the converted HDL data.

The setting module 104 amends formats of the converted HDL data according to requirements of each client 4. In one embodiment, the formats of the converted HDL data may include a number of columns, column names, and a column sequence. For example, if the converted HDL data includes forty columns but a client 4 only needs twenty columns, then the setting module 104 cancels the twenty unwanted columns.

The storing module 105 stores the HDL data with the amended formats in the library manager database 31. The client 4 draws a circuit diagram using the drawing unit 40 according to the HDL data with the amended formats stored in the library manager database 31.

Figure 3:
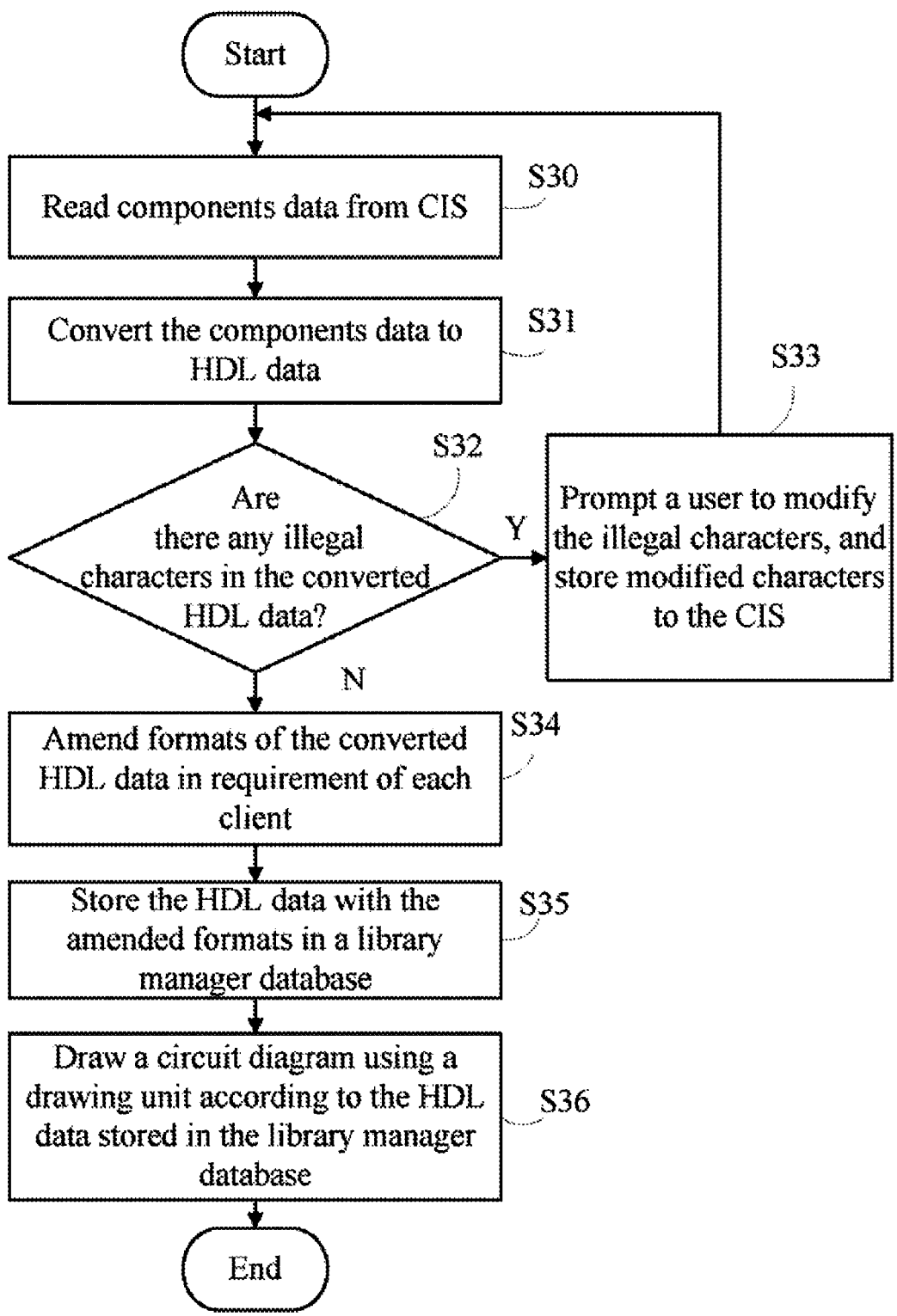
FIG. 3 is a flowchart illustrating one embodiment of a method for converting component data.

FIG. 3 is a flowchart illustrating a method for converting component data. Depending on the embodiment, additional steps may be added, others removed, and the ordering of the steps may be changed.

In step S30, the reading module 100 reads components data from the CIS 30.

In step S31, the converting module 101 converts the components data to HDL data which are described by HDL.

In step S32, the detecting module 102 detects if there are any illegal characters in the converted HDL data. If there are any illegal characters in the converted HDL data, step S33 is implemented. If there is no illegal character in the converted HDL data, step S34 is implemented.

In step S33, the changing module 103 prompts the user to modify the illegal characters, and stores modified characters to the CIS 30. The procedure returns to step S30.

In step S34, the setting module 104 amends formats of the converted HDL data according to requirements of each client 4.

In step S35, the storing module 105 stores the HDL data with the amended formats in the library manager database 31.

In step S36, the client 4 draws a circuit diagram using the drawing unit 40 according to the HDL data with the amended formats stored in the library manager database 31.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. An application server, comprising:
a storage system;

at least one processor; and one or more programs being stored in the storage system and executable by the at least one processor, the one or more programs comprising:

a reading module operable to read components data from a component information system of a database server connected to the application server;

a converting module operable to convert the components data to hardware description language (HDL) data;

a setting module operable to amend formats of the converted HDL data according to requirements of each of a plurality of clients connected to the application server; and a storing module operable to store the HDL data with the amended formats in a library manager database of the database server;

wherein the formats of the converted HDL data comprise a number of columns, column names and a column sequence.

2. The application server as described in claim 1, wherein the one or more programs further comprise:

a detecting module operable to detect whether there are any illegal characters in the converted HDL data; and a changing module operable to prompt a user to modify the illegal characters and store modified characters to a component information system (CIS) when there are illegal characters in the converted HDL data.

3. A computer-based method for triggering events of objects of an application server, the method being executed by at least one processor of an application server, and the method comprising:

reading components data from a component information system of a database server by the at least one processor;

converting the components data to hardware description language (HDL) data by the at least one processor;

amending formats of the converted HDL data according to requirements of each of a plurality of clients connected to the application server by the at least one processor; and storing the HDL data with the amended formats in a library manager database of the database server by the at least one processor;

wherein the formats of the converted HDL data comprise a number of columns, column names and a column sequence.

4. The method as described in claim 3, after step reading components data from a component information system of a database server further comprising:

detecting whether there are any illegal characters in the converted HDL data by the at least one processor; and prompting a user to modify the illegal characters and storing modified characters to the component information system (CIS) by the at least one processor when there are illegal characters in the converted HDL data.

5. A non-transitory storage medium having stored thereon instructions that, when executed by a processor, cause the processor to perform a method for converting components data, the method comprising:

reading components data from a component information system of a database server;

converting the components data to hardware description language (HDL) data;

amending formats of the converted HDL data according to requirements of each of a plurality of clients connected to the application server; and storing the HDL data with the amended formats in a library manager database of the database server;

wherein the formats of the converted HDL data comprise a number of columns, column names and a column sequence.

6. The non-transitory storage medium as described in claim 5, after step reading components data from a component information system of a database server further comprising:

detecting whether there are any illegal characters in the converted HDL data; and prompting a user to modify the illegal characters and storing modified characters to a component information system (CIS) when there are illegal characters in the converted HDL data.

\* \* \* \* \*